United States Patent
Quan et al.

(10) Patent No.: US 10,930,708 B2
(45) Date of Patent: Feb. 23, 2021

(54) OLED DISPLAY SUBSTRATE AND METHOD FOR MANUFACTURING THE SAME, DISPLAY DEVICE

(71) Applicant: BOE Technology Group Co., Ltd., Beijing (CN)

(72) Inventors: Wei Quan, Beijing (CN); Qing Liu, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/458,612

(22) Filed: Jul. 1, 2019

(65) Prior Publication Data
US 2020/0144335 A1    May 7, 2020

(30) Foreign Application Priority Data
Nov. 2, 2018    (CN) .......................... 201811300451.1

(51) Int. Cl.
| | | |
|---|---|---|
| H01L 27/32 | (2006.01) | |
| H01L 51/52 | (2006.01) | |
| H01L 51/56 | (2006.01) | |

(52) U.S. Cl.
CPC ...... H01L 27/3206 (2013.01); H01L 51/5218 (2013.01); H01L 51/5265 (2013.01);
(Continued)

(58) Field of Classification Search
CPC ............. H01L 51/5265; H01L 27/3211; H01L 2251/558; H01L 51/56; H01L 27/322; H01L 51/5088; G09G 2300/0426
(Continued)

(56) References Cited

U.S. PATENT DOCUMENTS 8,076,687 B2 * 12/2011 Kobayashi .......... H01L 51/5265
257/100
2006/0132026 A1    6/2006 Sarma et al.
(Continued)

FOREIGN PATENT DOCUMENTS

| CN | 101185178 A | 5/2008 |
|---|---|---|
| CN | 103137876 A | 6/2013 |

(Continued)

OTHER PUBLICATIONS

Office Action of CN Application No. 201811300451.1 and translation, dated Apr. 24, 2020, 14 pages.

*Primary Examiner* — Jonathan Han
(74) *Attorney, Agent, or Firm* — Muncy, Geissler, Olds & Lowe, P.C.

(57) ABSTRACT

An OLED display substrate, a method for manufacturing the same, and a display device are provided. The OLED display substrate includes multiple sub-pixels, and at least one sub-pixel includes: an anode, a cathode, and a light-emitting layer between the anode and the cathode. The anode includes: a light-reflective layer and a first transparent conductive layer covering the light-reflective layer, and the first transparent conductive layer is located between the light-reflective layer and the light-emitting layer. First vertical distances between first surfaces of the first transparent conductive layers of the subpixels of different colors facing the respective cathodes and the respective cathodes are the same, and second vertical distances between the first surfaces of the first transparent conductive layers of the sub-pixels of different colors and second surfaces of the respective light-reflective layers facing the respective cathodes are different.

20 Claims, 1 Drawing Sheet

(52) U.S. Cl.
CPC ........ *H01L 51/56* (2013.01); *H01L 2251/305* (2013.01); *H01L 2251/308* (2013.01); *H01L 2251/5315* (2013.01); *H01L 2251/5369* (2013.01)

(58) Field of Classification Search
USPC ........................................ 257/40, 89; 438/35
See application file for complete search history.

(56) References Cited

U.S. PATENT DOCUMENTS

| | | | | |
|---|---|---|---|---|
| 2011/0074272 | A1* | 3/2011 | Sakamoto | H01L 51/5265 313/113 |
| 2013/0001532 | A1* | 1/2013 | Hwang | H01L 51/5265 257/40 |
| 2014/0159022 | A1* | 6/2014 | Song | H01L 27/3248 257/40 |
| 2014/0183460 | A1 | 7/2014 | Kim et al. | |
| 2015/0380468 | A1 | 12/2015 | Fan et al. | |
| 2017/0117499 | A1 | 4/2017 | Zhang et al. | |
| 2017/0250231 | A1* | 8/2017 | Maeda | H01L 27/3206 |
| 2017/0250233 | A1* | 8/2017 | Ushikubo | H01L 51/5016 |

FOREIGN PATENT DOCUMENTS

| | | |
|---|---|---|
| CN | 103915468 A | 7/2014 |
| CN | 104112823 A | 10/2014 |
| CN | 105097874 A | 11/2015 |
| CN | 106159090 A | 11/2016 |
| CN | 108511617 A | 9/2018 |

\* cited by examiner

OLED DISPLAY SUBSTRATE AND METHOD FOR MANUFACTURING THE SAME, DISPLAY DEVICE

CROSS-REFERENCE TO RELATED APPLICATION

This application claims a priority to Chinese Patent Application No. 201811300451.1 filed on Nov. 2, 2018, the disclosure of which is incorporated in its entirety by reference herein.

TECHNICAL FIELD

The present disclosure relates to the field of display technologies, in particular to an OLED display substrate, a method for manufacturing the same and a display device.

BACKGROUND

For Organic Light-Emitting Diodes (OLED), when a current passes, holes generated by an anode and electrons generated by the cathode recombine in a light-emitting layer to emit light, and photons of different energies corresponding to different colors of light can be emitted depending on the excitation energy. Organic light-emitting display panels using an OLED component as a display material have been widely used in smart products such as mobile phones, televisions, and notebook computers due to advantages such as self-luminous, wide viewing angle, high contrast, and have been the focus of research in the field of display technologies due to characteristics such as being light in weight, thin in thickness, and resistant to bending.

SUMMARY

In a first aspect, an organic light-emitting diode (OLED) display substrate is provided according embodiments of the present disclosure, which includes a plurality of sub-pixels. At least one of the plurality of sub-pixels includes: an anode, a cathode, and a light-emitting layer between the anode and the cathode. The anode includes: a light-reflective layer, and a first transparent conductive layer covering the light-reflective layer, where the first transparent conductive layer is located between the light-reflective layer and the light-emitting layer. First vertical distances between first surfaces of the first transparent conductive layers of the subpixels of different colors facing to the respective cathodes and the respective cathodes are the same, and second vertical distances between the first surfaces of the first transparent conductive layers of the subpixels of different colors and second surfaces of the respective light-reflective layers facing to the respective cathodes are different.

In some optional embodiments, for each of the plurality of sub-pixels, a microcavity is formed between the anode and the cathode, the microcavity is configured to select light of a target wavelength from light emitted by the light-emitting layer, and a length of the microcavity is equal to the sum of the first vertical distance and the second vertical distance.

In some optional embodiments, thicknesses of the light-reflective layers in the anodes of the sub-pixels of different colors are different, and a total thickness of the anode of the sub-pixel of each color is the same as a total thickness of the anode of the sub-pixel of any other color.

In some optional embodiments, the anode further includes: a second transparent conductive layer on a side of the light-reflective layer facing away from the first transparent conductive layer.

In some optional embodiments, the first transparent conductive layer is made of zinc oxide (ZnO).

In some optional embodiments, the light-reflective layer is made of Ag.

In some optional embodiments, the second transparent conductive layer is made of indium tin oxide (ITO).

In some optional embodiments, the first transparent conductive layer is made of ZnO, the light-reflective layer is made of Ag, and the second transparent conductive layer is made of ITO.

In some optional embodiments, the second transparent conductive layer is formed from ZnO sol-gel, and the ZnO sol-gel is doped with nano silver particles or nano aluminum particles.

In some optional embodiments, the OLED display substrate includes a red sub-pixel, a blue sub-pixel and a green sub-pixel, a length of the microcavity of the red sub-pixel is larger than a length of the microcavity of the blue sub-pixel, and the length of the microcavity of the blue sub-pixel is larger than a length of the microcavity of the green sub-pixel.

In some optional embodiments, the light-reflective layer has a high reflectance.

In a second aspect, a method for manufacturing an OLED display substrate is provided according embodiments of the present disclosure, which includes forming a plurality of subpixels. The forming at least one of the plurality of subpixels includes: forming an anode, a cathode, and an organic light-emitting layer between the anode and the cathode, and the forming the anode includes:

forming a light-reflective layer; and forming a first transparent conductive layer covering the light-reflective layer, where the first transparent conductive layer is located between the light-reflective layer and the light-emitting layer, where first vertical distances between first surfaces of the first transparent conductive layers of the subpixels of different colors facing to the respective cathodes and the respective cathodes are the same, and second vertical distances between the first surfaces of the first transparent conductive layers of the subpixels of different colors and second surfaces of the respective light-reflective layers facing to the respective cathodes are different.

In some optional embodiments, the method further includes: forming a second transparent conductive layer on a side of the light-reflective layer facing away from the first transparent conductive layer.

In some optional embodiments, the forming the second transparent conductive layer includes: forming the second transparent conductive layer using indium tin oxide (ITO).

In some optional embodiments, the forming the light-reflective layer includes: printing silver sol-gel on the second transparent conductive layer to form the light-reflective layer.

In some optional embodiments, the forming the first transparent conductive layer includes: spin-coating ZnO on the light-reflective layer to form the first transparent conductive layer.

In some optional embodiments, before forming the anode, the method further includes: determining the second vertical distances for the plurality of sub-pixels based on wavelengths of light emitted by the plurality of sub-pixels.

In some optional embodiments, the OLED display substrate includes a red sub-pixel, a blue sub-pixel and a green sub-pixel, and the method further includes:

forming the light-reflective layers to enable a thickness of the light-reflective layer of the red sub-pixel to be smaller than a thickness of the light-reflective layer of the blue sub-pixel, and enable the thickness of the light-reflective layer of the blue sub-pixel to be smaller than a thickness of the light-reflective layer of the green sub-pixel; and forming the first transparent conductive layer on the light-reflective layer of each of the plurality of sub-pixels to enable a total thickness of the anode of each sub-pixel to be the same.

In a third aspect, a display device is further provided according embodiments of the present disclosure, which includes the above-mentioned OLED display substrate.

DETAILED DESCRIPTION

To make technical problems to be solved, technical solutions, and advantages of embodiments of the present disclosure become clearer, the embodiments are described below in detail in conjunction with drawings.

A common structure of an organic electroluminescent diode (OLED) is a sandwich structure including two electrodes and a light-emitting layer sandwiched between the two electrodes, and light is emitted from the transparent or translucent electrode. Indium tin oxide (ITO) is often used to form anodes of OLED devices due to its high light transmittance within a visible range, good electrical conductivity, and good hole injection capability. Vacuum evaporation and printing processes are usually used to form the light-emitting layer. A cathode of the OLED device is usually deposited or sputtered using a metal having a low work function such as aluminum, magnesium, silver or the like.

In an OLED device, a microcavity structure is formed between the anode and the cathode, and the microcavity structure is able to select a certain wavelength and enhance forward light coupling output. The microcavity structure may enhance emission characteristics of the light-emitting layer of the microcavity structure, enhance light emission near a resonant wavelength of the microcavity, and attenuate other wavelengths not corresponding to the resonant wavelength. However, in the OLED device in the related art, a distance between the anode and the cathode is fixed, accordingly, a depth or a length of the microcavity structure is also fixed, and the resonance wavelength of the microcavity structure is also fixed, which causes the microcavity structure of the OLED device only able to improve extraction efficiency of light at a specific wavelength. OLED display devices generally need to emit light of a plurality of different wavelengths, and the extraction efficiency of light of only a specific wavelength can be improved in the related art, thus resulting in poor display performance of the OLED device.

Embodiments of the present disclosure provide an OLED display substrate, a manufacturing method thereof, and a display device, which can improve display effects of an OLED display substrate in the related art.

Figure 1:
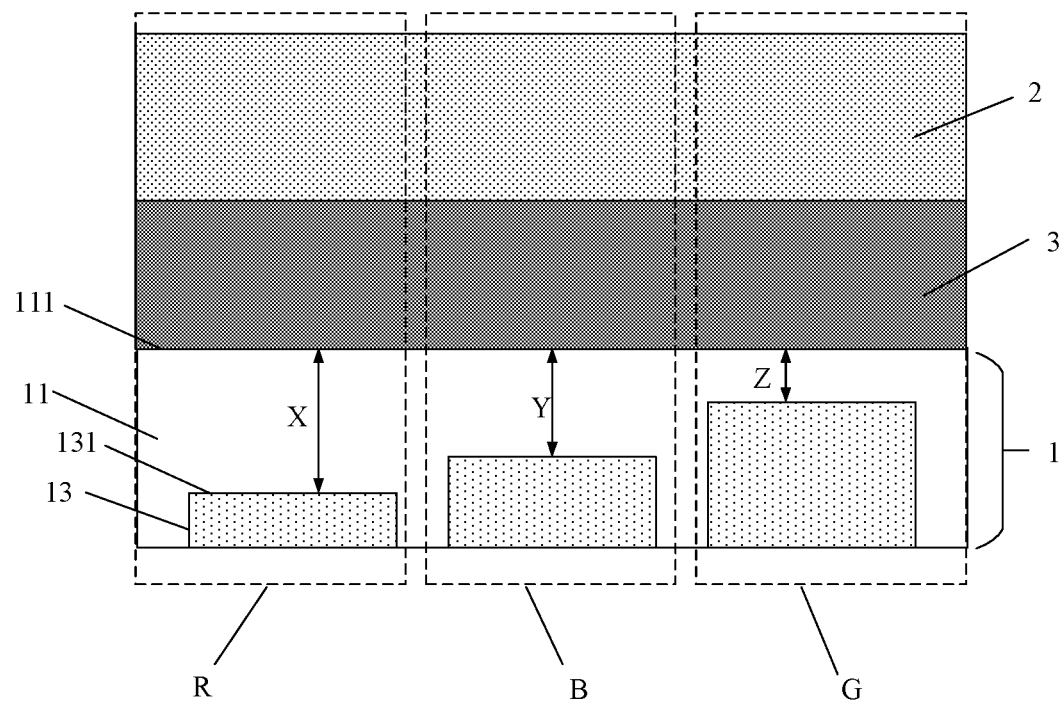
FIG. 1 is a schematic structural diagram of an OLED display substrate according to some embodiments of the present disclosure.

As shown in FIG. 1, embodiments of the present disclosure provide an OLED display substrate, which includes a plurality of sub-pixels. Each of the plurality of sub-pixels includes an anode 1, a cathode 2, and a light-emitting layer 3 between the anode 1 and the cathode 2. The anode 1 includes light-reflective layer 13 and a first transparent conductive layer 11 covering the light-reflective layer 13, and the first transparent conductive layer 11 is located between the light-reflective layer 13 and the light-emitting layer 3. First vertical distances between first surfaces 111 of the first transparent conductive layers 11 of the subpixels of different colors facing to the respective cathodes 2 and the respective cathodes 2 are the same, and second vertical distances between the first surfaces 111 of the first transparent conductive layers 11 of the subpixels of different colors and second surfaces 131 of the respective light-reflective layers 13 facing to the respective cathodes 2 are different.

For each of the plurality of sub-pixels, a microcavity is formed between the anode 1 and the cathode 2, and the microcavity is configured to select light of a target wavelength from light emitted by the light-emitting layer 3. For example, the wavelength selection mechanism of the microcavity may include selecting a target wavelength by total reflection. As shown in FIG. 1, a length of the microcavity is equal to the sum of the first vertical distance and the second vertical distance.

For the OLED display substrate in the embodiments, the first vertical distances between the first surfaces of the first transparent conductive layers of the subpixels of different colors facing to the respective cathodes and the respective cathodes are the same, the second vertical distances between the first surfaces of the first transparent conductive layers of the subpixels of different colors and second surfaces of the respective light-reflective layers facing to the respective cathodes are different, and the length of the microcavity structure of each subpixel is equal to the sum of the first vertical distance and the second vertical distance. In this way, different lengths of microcavity structures can be set for sub-pixels of different colors according to optical characteristics of the sub-pixels, so that the microcavity of each sub-pixel has a resonance wavelength corresponding to a desired peak wavelength of the corresponding sub-pixel, and luminous efficiency and a position of luminescent peak of the sub-pixels of each color are improved. Therefore, the luminescent peak can be narrowed, a color gamut of the display device can be widen, and display demands can be flexibly set.

In some optional embodiments, thicknesses of the light-reflective layers 13 in the anodes 1 of the sub-pixels of different colors are different, and a total thickness of the anode 1 of the sub-pixel of each color is the same as a total thickness of the anode 1 of the sub-pixel of any other color.

Figure 2:
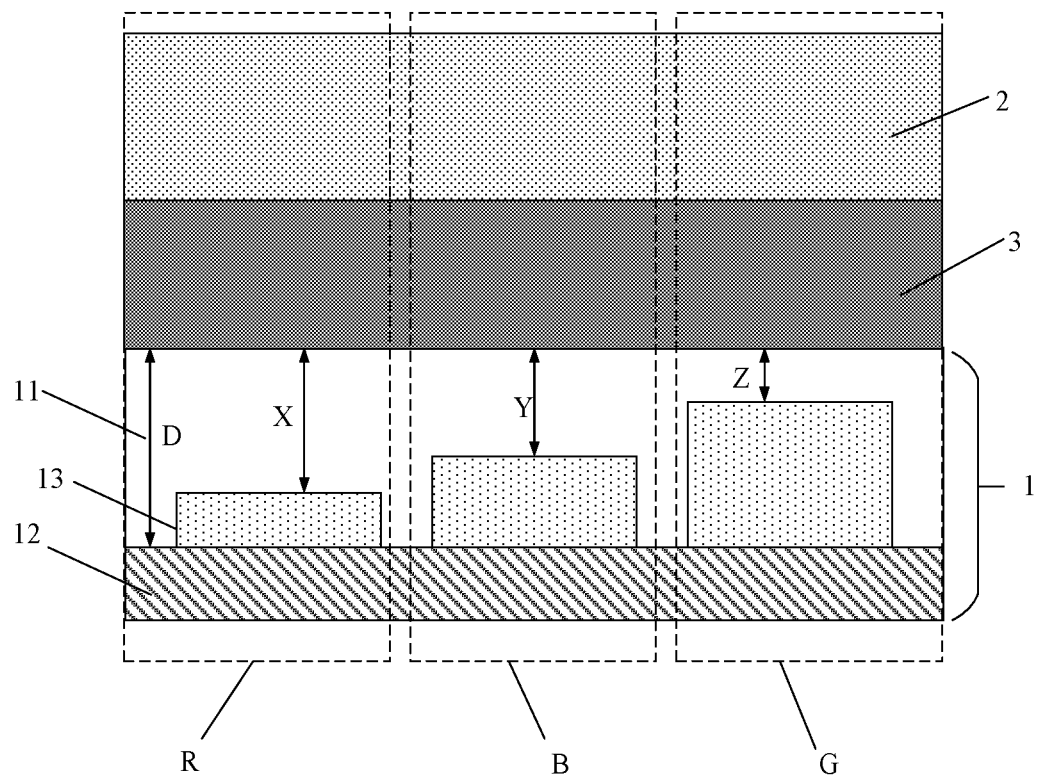
FIG. 2 is a schematic structural diagram of an OLED display substrate according to some embodiments of the present disclosure.

In some optional embodiments, as shown in FIG. 2, the anode 1 further includes: a second transparent conductive layer 12 located on a side of the light-reflective layer 13 facing away from the first transparent conductive layer 11.

In some optional embodiments, the first transparent conductive layer may be made of ZnO, the light-reflective layer may be made of Ag or Al, and the second transparent conductive layer may be made of ITO. The first transparent conductive layer, the light-reflective layer, and the second transparent conductive layer may constitute a laminated structure of the first transparent conductive layer, the light-reflective layer, and the ITO. The light-reflective layer is configured to increase the conductivity of the anode and functions as a reflective surface, and the ITO layer is used to achieve work function matching of the OLED device.

In some optional embodiments, the OLED display substrate is a top-emitting OLED device, and a side of the cathode 3 far away from the anode 1 is a light-emitting side. The light-reflective layer 13 has a high reflectance, and after the light emitted by the light-emitting layer 3 enters the light-reflective layer 13, most of the light is reflected by the light-reflective layer 13 to the light-emitting side and propagates outside of the OLED device. Optionally, the reflectance of the light-reflective layer 13 is set to be greater than 80%. It should be noted that the material of the first transparent conductive layer is not limited to ZnO, and may be other transparent conductive materials. The first transparent conductive layer may be formed from ZnO sol-gel, and may be prepared by a spin coating process, and the preparation process is relatively simple.

In some optional embodiments, in order to improve the electrical conductivity of ZnO, the ZnO sol-gel may be doped with nano silver particles or nano aluminum particles.

In some optional embodiments, the OLED display substrate includes a red sub-pixel, a blue sub-pixel, and a green sub-pixel, and a length of the microcavity of the red sub-pixel is larger than a length of the microcavity of the blue sub-pixel, and the length of the microcavity of the blue sub-pixel is larger than a length of the microcavity of the green sub-pixel.

For each sub-pixel, the length of the microcavity is equal to a vertical distance between the first surface 111 of the first transparent conductive layer 11 facing the cathode 2. The larger the length of the microcavity is, the larger the wavelength of the outgoing light selected by the microcavity is.

It should be noted that FIG. 1 is only a schematic view. In practical applications, the anodes of different sub-pixels may be insulated from each other. In addition, FIG. 1 shows that sub-pixels of different colors are red sub-pixel R, green sub-pixel G, and blue sub-pixel B, and sub-pixels may also emit light of other colors, for example white sub-pixels. The color of light emitted by the sub-pixel can be reasonably designed according to the actual situation, which is not limited in the disclosure.

The display mode of the large-sized OLED display substrate is that the white light emitted by OLED displays red, green and blue after passing through a filter film of a corresponding color, and the sub-pixels of different colors need to enhance the light of different wavelengths, and lengths of microcavity structures of the sub-pixels of different colors need to be designed different.

In some optional embodiments, for sub-pixels of different colors such as red sub-pixel R, green sub-pixel G, and blue sub-pixel B, thicknesses of the first transparent conductive layers 11 are all equal, and thicknesses of the second transparent conductive layers 12 are all equal. As shown in FIG. 2, the thicknesses of the first transparent conductive layers 11 of the sub-pixels of different colors are D. A vertical distance between a second surface 131 of the light-reflecting layer 13 of the red sub-pixel R facing the cathode 2 and a first surface 111 of the first transparent conductive layer 11 facing the cathode 2 is X, a vertical distance between a second surface 131 of the light-reflecting layer 13 of the red sub-pixel R facing the cathode 2 and a first surface 111 of the first transparent conductive layer 11 facing the cathode 2 is Y, and a vertical distance between a second surface 131 of the light-reflecting layer 13 of the green sub-pixel G facing the cathode 2 and a first surface 111 of the first transparent conductive layer 11 facing the cathode 2 is Z.

In the embodiments, the optimal length of the microcavity structure of each color of sub-pixel is determined according to a wavelength of light emitted by the red sub-pixel R, the green sub-pixel G, and the blue sub-pixel B, where the length of the microcavity structure of the red sub-pixel R is equal to the sum of the vertical distance between the first surface and the cathode 2 and X, the length of the microcavity structure of the blue sub-pixel B is equal to the sum of the vertical distance between the first surface and the cathode 2 and Y, and the length of the microcavity structure of the green sub-pixel G is equal to the sum of the vertical distance between the first surface and the cathode 2 and Z. After determining the vertical distances between the first surfaces 111 of the first transparent conductive layers 11 of the subpixels of different colors (R, G and B) and the cathode 2, values of X, Y and Z may be determined according to the optimal length of the microcavity structure. The thickness of the first transparent conductive layer 11 and the light-reflective layer 13 may be determined for each sub-pixel based on the values of X, Y and Z, as the first transparent conductive layers 11 of the subpixels of different colors have a same thickness.

After the second transparent conductive layer 12 is formed, the light-reflective layer 13 is formed on the second transparent conductive layer 12 according to the determined thickness, and ZnO sol-gel is prepared on the light-reflective layer 13 by spin coating, and is then sintered by a muffle furnace to form the first transparent conductive layer 11. Preparing a ZnO electrode through a spin-coating process is simple, and thus reducing the cost of the OLED display substrate.

In a specific example, the thickness of the light-reflective layer 13 of the red sub-pixel R may be designed to be 1000 angstroms, the thickness of the light-reflective layer 13 of the blue sub-pixel B may be designed to be 1250 angstroms, and the thickness of the light-reflective layer of the green sub-pixel G is designed to be 1800 angstroms. The total thickness of the first transparent conductive layer 11 is set to 1920 angstroms, so that the X value of the red sub-pixel R is 920 angstroms, the Y value of the blue sub-pixel B is 670 angstroms, and the Z value of the green sub-pixel G is 120 angstroms.

It should be understood that a peak wavelength of light emitted by each color of sub-pixel depends on the length of the microcavity of the corresponding sub-pixel and a wavelength selection mechanism of the microcavity. For example, the wavelength selection mechanism of the microcavity may include screening out a target wavelength by total reflection. In the case where the wavelength selection mechanism of the microcavity is the same for the subpixels of different colors, the longer the length of the microcavity is, the longer the wavelength of the target light selected by the microcavity is. The above embodiments are to calculate the thickness of the light-reflective layer for each color of sub-pixel under the assumption that the wavelength selection mechanisms of the sub-pixels of different colors are the same to simplify the calculation. In practical applications, the wavelength selection mechanisms may be different for sub-pixels of different colors.

In the embodiments, according to the luminous requirements of sub-pixels of different colors, different thicknesses of the light-reflecting layers are designed to obtain different lengths of microcavity structures, and the optical performance of each sub-pixel is adjusted to improve the luminous efficiency of each sub-pixel and a position of a luminescent peak. Therefore, the luminescent peak can be narrowed, and a color gamut of the display device can be widen.

Embodiments of the present disclosure further provides a method for manufacturing an OLED display substrate, including forming a plurality of subpixels. The forming each of the plurality of subpixels includes: forming an anode, a cathode, and an organic light-emitting layer between the anode and the cathode, and the forming the anode includes: forming a light-reflective layer; and forming a first transparent conductive layer covering the light-reflective layer, where the first transparent conductive layer is located between the light-reflective layer and the light-emitting layer, First vertical distances between first surfaces of the first transparent conductive layers of the subpixels of different colors facing to the respective cathodes and the respective cathodes are the same, and second vertical distances between the first surfaces of the first transparent conductive layers of the subpixels of different colors and second surfaces of the respective light-reflective layers facing to the respective cathodes are different.

In method for manufacturing the OLED display substrate in the embodiments, first vertical distances between the first surfaces of the first transparent conductive layers of the subpixels of different colors facing to the respective cathodes and the respective cathodes are the same, the second vertical distances between the first surfaces of the first transparent conductive layers of the subpixels of different colors and second surfaces of the respective light-reflective layers facing to the respective cathodes are different, and the length of the microcavity structure of each subpixel is equal to the sum of the first vertical distance and the second vertical distance. In this way, different lengths of microcavity structures can be set for sub-pixels of different colors according to optical characteristics of the sub-pixels, so that the microcavity of each sub-pixel has a resonance wavelength corresponding to a desired peak wavelength of the corresponding sub-pixel, and luminous efficiency and a position of luminescent peak of the sub-pixels of each color are improved. Therefore, the luminescent peak can be narrowed, a color gamut of the display device can be widen, and display demands can be flexibly set.

In some optional embodiments, the method for manufacturing the OLED display substrate further includes: forming a second transparent conductive layer on a side of the light-reflective layer facing away from the first transparent conductive layer.

In some optional embodiments, the first transparent conductive layer may be made of ZnO, the light-reflective layer may be made of Ag or Al, and the second transparent conductive layer may be made of ITO. The first transparent conductive layer, the light-reflective layer, and the second transparent conductive layer may constitute a laminated structure of the first transparent conductive layer, the light-reflective layer, and the ITO. The light-reflective layer is configured to increase the conductivity of the anode and functions as a reflective surface, and the ITO layer is used to achieve work function matching of the OLED device.

A material of the first transparent conductive layer is not limited to ZnO, and may be other transparent conductive materials. The first transparent conductive layer may be formed from ZnO sol-gel, and may be prepared by a spin coating process, and the preparation process is relatively simple.

In some optional embodiments, the forming the light-reflective layer includes: printing silver sol-gel on the second transparent conductive layer to form the light-reflective layer.

In some optional embodiments, the forming the first transparent conductive layer includes: spin-coating ZnO on the light-reflective layer to form the first transparent conductive layer.

In some optional embodiments, before forming the anode, the method further includes: determining the second vertical distances for the plurality of sub-pixels based on wavelengths of light emitted by the plurality of sub-pixels.

In some optional embodiments, the OLED display substrate includes a red sub-pixel, a blue sub-pixel, and a green sub-pixel, and the method further includes:
forming the light-reflective layers to enable a thickness of the light-reflective layer of the red sub-pixel to be smaller than a thickness of the light-reflective layer of the blue sub-pixel, and enable the thickness of the light-reflective layer of the blue sub-pixel to be smaller than a thickness of the light-reflective layer of the green sub-pixel; and
forming the first transparent conductive layer on the light-reflective layer of each of the plurality of sub-pixels to enable a total thickness of the anode of each sub-pixel to be the same.

For each sub-pixel, a length of the microcavity structure is equal to the sum of a vertical distance between the first surface and the cathode and a vertical distance between the first surface and the second surface, and thus different lengths of microcavity structures may be set for sub-pixels of different colors according to the respective optical needs of the sub-pixels. As vertical distances between the first surfaces and the cathode are the same for the sub-pixels of different colors, a vertical distance between the first surface and the second surfaces for each of the sub-pixels of different colors may be determined according to an optimal length of the microcavity structure of each color of sub-pixel, and the light-reflecting layer and the first transparent conductive layer are formed according to the vertical distance.

In an embodiment, as shown in FIG. 1, the anode includes a second transparent conductive layer 12, a light-reflective layer 13 on the second transparent conductive layer 12, and a first transparent conductive layer 11 covering the light-reflective layer 13. The second transparent conductive layer 12 may be made of ITO, the light-reflective layer 13 may be made of Ag, and the first transparent conductive layer 11 may be made of ZnO. It should be noted that FIG. 1 is only a schematic diagram, and in practical applications, anodes of different sub-pixels may be insulated from each other.

The display mode of the large-sized OLED display substrate is that the white light emitted by OLED displays red, green and blue after passing through a filter film of a corresponding color, and the sub-pixels of different colors need to enhance the light of different wavelengths, and lengths of microcavity structures of the sub-pixels of different colors need to be designed different.

In some optional embodiments, for sub-pixels of different colors such as red sub-pixel R, green sub-pixel G, and blue sub-pixel B, thicknesses of the first transparent conductive layers 11 are all equal, and thicknesses of the second transparent conductive layers 12 are all equal. As shown in FIG. 2, the thicknesses of the first transparent conductive layers 11 of the sub-pixels of different colors are D. A vertical distance between a second surface 131 of the light-reflecting layer 13 of the red sub-pixel R facing the cathode 2 and a first surface 111 of the first transparent conductive layer 11 facing the cathode 2 is X, a vertical distance between a second surface 131 of the light-reflecting layer 13 of the red sub-pixel R facing the cathode 2 and a first surface 111 of the first transparent conductive layer 11 facing the cathode 2 is Y, and a vertical distance between a second surface 131 of the light-reflecting layer 13 of the green sub-pixel G facing the cathode 2 and a first surface 111 of the first transparent conductive layer 11 facing the cathode 2 is Z.

In the embodiments, the optimal length of the microcavity structure of each color of sub-pixel is determined according to a wavelength of light emitted by the red sub-pixel R, the green sub-pixel G, and the blue sub-pixel B, where the length of the microcavity structure of the red sub-pixel R is equal to the sum of the vertical distance between the first surface and the cathode 2 and X, the length of the microcavity structure of the blue sub-pixel B is equal to the sum of the vertical distance between the first surface and the cathode 2 and Y, and the length of the microcavity structure of the green sub-pixel G is equal to the sum of the vertical distance between the first surface and the cathode 2 and Z. After determining the vertical distances between the first surfaces 111 of the first transparent conductive layers 11 of the subpixels of different colors (R, G and B) and the cathode 2, values of X, Y and Z may be determined according to the optimal length of the microcavity structure. The thickness of the first transparent conductive layer 11 and the light-reflective layer 13 may be determined for each sub-pixel based on the values of X, Y and Z, as the first transparent conductive layers 11 of the subpixels of different colors have a same thickness.

After the second transparent conductive layer 12 is formed, the light-reflective layer 13 is formed on the second transparent conductive layer 12 according to the determined thickness, and ZnO sol-gel is prepared on the light-reflective layer 13 by spin coating, and is then sintered by a muffle furnace to form the first transparent conductive layer 11. Preparing a ZnO electrode through a spin-coating process is simple, and thus reducing the cost of the OLED display substrate.

In a specific example, the thickness of the light-reflective layer 13 of the red sub-pixel R may be designed to be 1000 angstroms, the thickness of the light-reflective layer 13 of the blue sub-pixel B may be designed to be 1250 angstroms, and the thickness of the light-reflective layer of the green sub-pixel G is designed to be 1800 angstroms. The total thickness of the first transparent conductive layer 11 is set to 1920 angstroms, so that the X value of the red sub-pixel R is 920 angstroms, the Y value of the blue sub-pixel B is 670 angstroms, and the Z value of the green sub-pixel G is 120 angstroms.

In the embodiments, according to the luminous requirements of sub-pixels of different colors, different thicknesses of the light-reflecting layers are designed to obtain different lengths of microcavity structures, and the optical performance of each sub-pixel is adjusted to improve the luminous efficiency of each sub-pixel and a position of a luminescent peak. Therefore, the luminescent peak can be narrowed, and a color gamut of the display device can be widen.

Embodiments of the present disclosure further provide a display device including the OLED display substrate 10 as described above. The display device may be any product or component having a display function, such as a television, a display, a digital photo frame, a mobile phone, and a tablet computer. The display device further includes a flexible circuit board, a printed circuit board, and a back plate.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", or "comprising" and the like mean that an element or an article preceding the term contains elements or items and equivalents thereof behind the term, but does not exclude other elements or items. Such terms as "connected", or "interconnected" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" the another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. An Organic Light-Emitting Diode (OLED) display substrate, comprising a plurality of sub-pixels, wherein at least one of the plurality of sub-pixels comprises:
    an anode, a cathode, and a light-emitting layer between the anode and the cathode; wherein the anode comprises:
        a light-reflective layer, and
        a first transparent conductive layer covering the light-reflective layer, wherein the first transparent conductive layer is located between the light-reflective layer and the light-emitting layer;
    wherein first vertical distances between first surfaces of the first transparent conductive layers of the subpixels of different colors facing to the respective cathodes and the respective cathodes are the same, and second vertical distances between the first surfaces of the first transparent conductive layers of the subpixels of different colors and second surfaces of the respective light-reflective layers facing to the respective cathodes are different, and
    wherein thicknesses of the light-reflective layers in the anodes of the sub-pixels of different colors are different, and a total thickness of the anode of the sub-pixel of each color is the same as a total thickness of the anode of the sub-pixel of any other color.

2. The OLED display substrate according to claim 1, wherein for each of the plurality of sub-pixels, a microcavity is formed between the anode and the cathode, the microcavity is configured to select light of a target wavelength from light emitted by the light-emitting layer, and a length of the microcavity is equal to the sum of the first vertical distance and the second vertical distance.

3. The OLED display substrate according to claim 2, wherein the OLED display substrate comprises a red sub-pixel, a blue sub-pixel and a green sub-pixel, a length of the microcavity of the red sub-pixel is larger than a length of the microcavity of the blue sub-pixel, and the length of the microcavity of the blue sub-pixel is larger than a length of the microcavity of the green sub-pixel.

4. The OLED display substrate according to claim 1, wherein the anode further comprises:
    a second transparent conductive layer on a side of the light-reflective layer facing away from the first transparent conductive layer.

5. The OLED display substrate according to claim 4, wherein the second transparent conductive layer is made of indium tin oxide (ITO).

6. The OLED display substrate according to claim 4, wherein the first transparent conductive layer is made of ZnO, the light-reflective layer is made of Ag, and the second transparent conductive layer is made of ITO.

7. The OLED display substrate according to claim 1, wherein the first transparent conductive layer is made of zinc oxide (ZnO).

8. The OLED display substrate according to claim 7, wherein the light-reflective layer is made of Ag.

9. The OLED display substrate according to claim 7, wherein the second transparent conductive layer is formed from ZnO sol-gel, and the ZnO sol-gel is doped with nano silver particles or nano aluminum particles.

10. The OLED display substrate according to claim 1, wherein the light-reflective layer has a high reflectance.

11. A display device, comprising the OLED display substrate according to claim 1.

12. A method for manufacturing an OLED display substrate, comprising: forming a plurality of subpixels, wherein the forming at least one of the plurality of subpixels comprises: forming an anode, a cathode, and an organic light-emitting layer between the anode and the cathode, and the forming the anode comprises:
    forming a light-reflective layer; and
    forming a first transparent conductive layer covering the light-reflective layer, wherein the first transparent conductive layer is located between the light-reflective layer and the light-emitting layer,
    wherein first vertical distances between first surfaces of the first transparent conductive layers of the subpixels of different colors facing to the respective cathodes and the respective cathodes are the same, and second vertical distances between the first surfaces of the first transparent conductive layers of the subpixels of different colors and second surfaces of the respective light-reflective layers facing to the respective cathodes are different, and
    wherein thicknesses of the light-reflective layers in the anodes of the sub-pixels of different colors are different, and a total thickness of the anode of the sub-pixel of each color is the same as a total thickness of the anode of the sub-pixel of any other color.

13. The method for manufacturing an OLED display substrate according to claim 12, further comprising:
    forming a second transparent conductive layer on a side of the light-reflective layer facing away from the first transparent conductive layer.

14. The method for manufacturing an OLED display substrate according to claim 13, wherein the forming the second transparent conductive layer comprises: forming the second transparent conductive layer using indium tin oxide (ITO).

15. The method for manufacturing an OLED display substrate according to claim 14, wherein the forming the light-reflective layer comprises: printing silver sol-gel on the second transparent conductive layer to form the light-reflective layer.

16. The method for manufacturing an OLED display substrate according to claim 15, wherein the forming the first transparent conductive layer comprises: spin-coating ZnO on the light-reflective layer to form the first transparent conductive layer.

17. The method for manufacturing an OLED display substrate according to claim 12, wherein before forming the anode, the method further comprises:
    determining the second vertical distances for the plurality of sub-pixels based on wavelengths of light emitted by the plurality of sub-pixels.

18. The method for manufacturing an OLED display substrate according to claim 12, wherein the OLED display substrate comprises a red sub-pixel, a blue sub-pixel and a green sub-pixel, and the method further comprises:
    forming the light-reflective layers to enable a thickness of the light-reflective layer of the red sub-pixel to be smaller than a thickness of the light-reflective layer of the blue sub-pixel, and enable the thickness of the light-reflective layer of the blue sub-pixel to be smaller than a thickness of the light-reflective layer of the green sub-pixel; and
    forming the first transparent conductive layer on the light-reflective layer of each of the plurality of sub-pixels to enable a total thickness of the anode of the sub-pixel of each color to be the same as a total thickness of the anode of the sub-pixel of any other color.

19. An Organic Light-Emitting Diode (OLED) display substrate, comprising a plurality of sub-pixels, wherein at least one of the plurality of sub-pixels comprises:
    an anode, a cathode, and a light-emitting layer between the anode and the cathode; wherein the anode comprises:
        a light-reflective layer, and
        a first transparent conductive layer covering the light-reflective layer, wherein the first transparent conductive layer is located between the light-reflective layer and the light-emitting layer;
    wherein first vertical distances between first surfaces of the first transparent conductive layers of the subpixels of different colors facing to the respective cathodes and the respective cathodes are the same, and second vertical distances between the first surfaces of the first transparent conductive layers of the subpixels of different colors and second surfaces of the respective light-reflective layers facing to the respective cathodes are different, and
    wherein the first transparent conductive layer is made of zinc oxide (ZnO), the second transparent conductive layer is formed from ZnO sol-gel, and the ZnO sol-gel is doped with nano silver particles or nano aluminum particles.

20. The OLED display substrate according to claim 19, wherein thicknesses of the light-reflective layers in the anodes of the sub-pixels of different colors are different, and a total thickness of the anode of the sub-pixel of each color is the same as a total thickness of the anode of the sub-pixel of any other color.

* * * * *